United States Patent
Yu et al.

(10) Patent No.: US 10,283,427 B2
(45) Date of Patent: May 7, 2019

(54) MOLDING STRUCTURE FOR WAFER LEVEL PACKAGE

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Chih-Fan Huang, Kaohsiung (TW); Chih-Wei Lin, Zhubei (TW); Wei-Hung Lin, Xinfeng Township (TW); Ming-Da Cheng, Jhubei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/911,281

(22) Filed: Mar. 5, 2018

(65) Prior Publication Data
US 2018/0190555 A1 Jul. 5, 2018

Related U.S. Application Data

(60) Continuation of application No. 15/218,834, filed on Jul. 25, 2016, now Pat. No. 9,911,674, which is a
(Continued)

(51) Int. Cl.
*H01L 23/28* (2006.01)
*H01L 23/29* (2006.01)
(Continued)

(52) U.S. Cl.
CPC ........ *H01L 23/295* (2013.01); *H01L 23/3114* (2013.01); *H01L 23/3128* (2013.01); *H01L 23/5384* (2013.01); *H01L 23/5386* (2013.01); *H01L 23/5389* (2013.01); *H01L 24/17* (2013.01); *H01L 24/18* (2013.01); *H01L 24/19* (2013.01); *H01L 24/97* (2013.01); *H01L 25/105* (2013.01); *H01L 21/561* (2013.01); *H01L 21/568* (2013.01); *H01L 24/73* (2013.01); *H01L 2224/04105* (2013.01); *H01L 2224/12105* (2013.01); *H01L 2224/32225* (2013.01); *H01L 2224/45015* (2013.01); *H01L 2224/48095* (2013.01); *H01L 2224/48227* (2013.01); *H01L 2224/73265* (2013.01); *H01L 2224/73267* (2013.01); *H01L 2224/92244* (2013.01);
(Continued)

(58) Field of Classification Search
CPC ................................. H01L 29/00; H01L 21/00
USPC ........................... 257/738, 787; 438/50, 107
See application file for complete search history.

(56) References Cited

U.S. PATENT DOCUMENTS 5,652,436 A * 7/1997 Stoner ................. H01L 21/2007
257/416
7,351,321 B2 * 4/2008 Cohen ................. B81C 1/00126
205/118
(Continued)

*Primary Examiner* — Jami Valentine Miller
(74) *Attorney, Agent, or Firm* — Slater Matsil, LLP

(57) ABSTRACT

Apparatus, and methods of manufacture thereof, in which a molding compound is formed between spaced apart microelectronic devices. The molding compound comprises micro-filler elements. No boundary of any of the micro-filler elements is substantially parallel to a substantially planar surface of the molding compound, or to a substantially planar surface of any of the microelectronic devices.

20 Claims, 8 Drawing Sheets

Related U.S. Application Data division of application No. 14/222,423, filed on Mar. 21, 2014, now Pat. No. 9,401,337.

(60) Provisional application No. 61/917,827, filed on Dec. 18, 2013.

(51) Int. Cl.
*H01L 23/00* (2006.01)
*H01L 23/31* (2006.01)
*H01L 23/538* (2006.01)
*H01L 25/10* (2006.01)
*H01L 21/56* (2006.01)

(52) U.S. Cl.
CPC .. *H01L 2224/97* (2013.01); *H01L 2225/1035* (2013.01); *H01L 2225/1058* (2013.01); *H01L 2924/00014* (2013.01); *H01L 2924/12042* (2013.01); *H01L 2924/15311* (2013.01); *H01L 2924/181* (2013.01); *H01L 2924/18162* (2013.01)

(56) References Cited

U.S. PATENT DOCUMENTS

| | | | |
|---|---|---|---|
| 9,082,881 B1* | 7/2015 | Hackler, Sr. | H01L 21/84 |
| 2006/0261498 A1* | 11/2006 | James | H01L 21/565 |
| | | | 257/787 |
| 2014/0084482 A1* | 3/2014 | Hu | H01L 24/06 |
| | | | 257/774 |

* cited by examiner

//MOLDING STRUCTURE FOR WAFER LEVEL PACKAGE

PRIORITY CLAIM AND CROSS-REFERENCE

This application is a continuation of and claims the benefit of U.S. application Ser. No. 15/218,834, entitled "Molding Structure for Wafer Level Package," filed Jul. 25, 2016, which is a divisional of and claims the benefit of U.S. application Ser. No. 14/222,423, entitled "Molding Structure For Wafer Level Package," filed Mar. 21, 2014, now U.S. Pat. No. 9,401,337 issued Jul. 26, 2016, which claims the benefit of U.S. Provisional Application No. 61/917,827, entitled "Molding Structure For Wafer Level Package," filed Dec. 18, 2013, the entire disclosures of which applications are hereby incorporated herein by reference.

BACKGROUND

For wafer-level, exposed-molding packaging, molding residue on a chip may cause redistribution layer (RDL) delamination defects and failures. For example, oxidation of device contacts during processing may cause delamination and perhaps open-fails on the RDL layer. Other issues that may present challenges to device function are the use of grinding and other mechanical means for removing materials. Such practices may add to manufacturing costs and/or negatively affect components, such as with overgrinding and material residue. Device reliability can also be compromised by uncontrolled recesses between a die and molding compound thereon, as well as when the RDL simultaneously contacts too many different materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
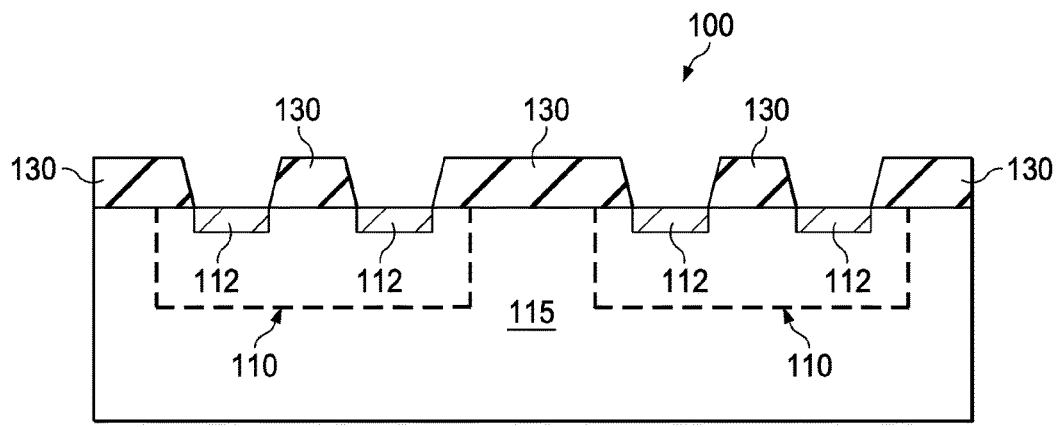
FIG. 1 is a schematic view of at least a portion of apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of at least a portion of an apparatus 100 in an intermediate stage of manufacture according to one or more aspects of the present disclosure. The apparatus 100 comprises a plurality of microelectronic devices 110 formed in and/or on a substrate 115. The apparatus 100 may further comprise a first dielectric layer 130 over portions of the microelectronic devices 110.

For example, the first dielectric layer 130 may have openings exposing one or more electrical contacts 112 of one or more of the microelectronic devices 110. The electrical contacts 112 may comprise copper, aluminum, doped poly silicon, and/or other materials. The first dielectric layer 130 may comprise PBO (polybenzoxazole) and/or other dielectric materials, and may have a thickness ranging between about one micron and about twenty microns. However, other thicknesses are also within the scope of the present disclosure. The first dielectric layer 130 may be deposited on the substrate 115 by chemical-vapor deposition (CVD), plasma-enhanced CVD (PECVD), metal organic CVD (MOCVD), and/or other processes, and subsequently patterned by one or more photolithography processes. One or more chemical-mechanical planarizing (CMP), grinding, polishing, and/or other mechanical material removal processes may also be utilized during the formation of the patterned first dielectric layer 130 depicted in FIG. 1.

Figure 2:
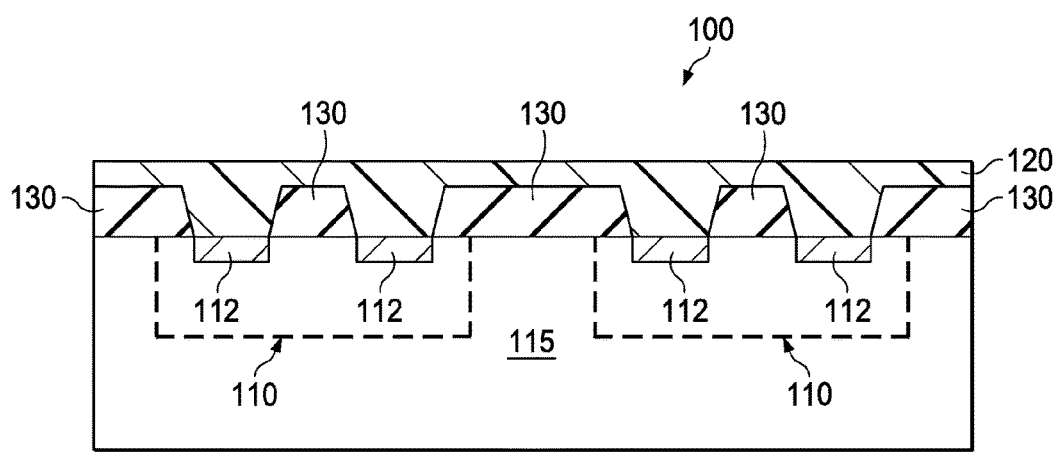
FIG. 2 is a schematic view of the apparatus shown in FIG. 1 in a subsequent stage of manufacture in accordance with some embodiments.

FIG. 2 is a sectional view of the apparatus 100 shown in FIG. 1 in a subsequent stage of manufacture according to one or more aspects of the present disclosure. In FIG. 2, a sacrificial layer 120 has been deposited over the first dielectric layer 130. Such deposition may include forming portions of the sacrificial layer 120 in the openings in the first dielectric layer on the electrical contacts 112. The sacrificial layer 120 may protect the electrical contacts 112 from oxidation, and may comprise one or more organic polymers and/or other materials. The sacrificial layer 120 may be deposited by one or more CVD processes, spin-on coating, and/or other processes, perhaps to a thickness ranging between about one microns and about ten microns over the first dielectric layer 130.

Figure 3:
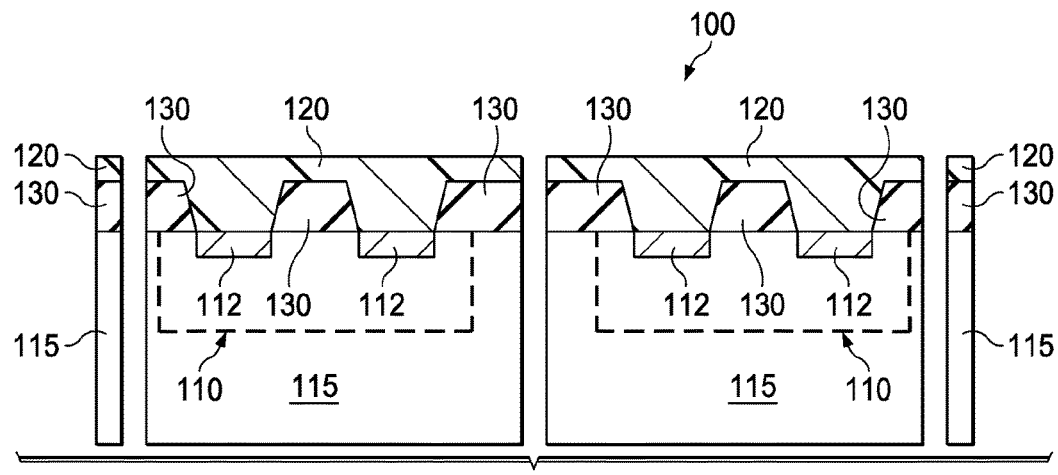
FIG. 3 is a schematic view of the apparatus shown in FIG. 2 in a subsequent stage of manufacture in accordance with some embodiments.

FIG. 3 is a sectional view of the apparatus 100 shown in FIG. 2 in a subsequent stage of manufacture according to one or more aspects of the present disclosure. In FIG. 3, the microelectronic devices 110 have been separated. Separating the microelectronic devices may utilize grinding, dicing, laser cutting, sawing, and/or other processes to physically separate the microelectronic devices 110 from each other.

Figure 4:
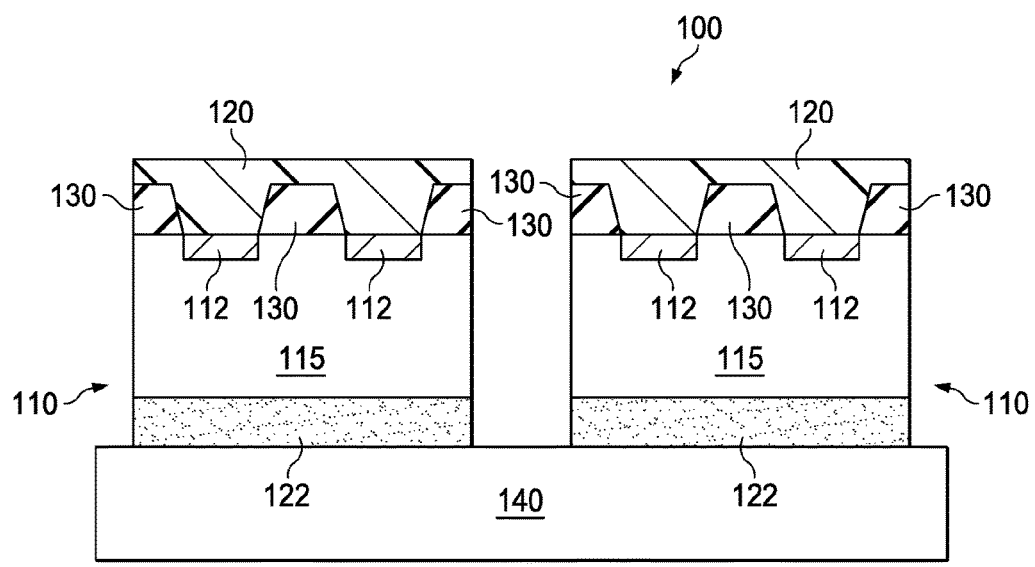
FIG. 4 is a schematic view of the apparatus shown in FIG. 3 in a subsequent stage of manufacture in accordance with some embodiments.

FIG. 4 is a sectional view of the apparatus 100 shown in FIG. 3 in a subsequent stage of manufacture according to one or more aspects of the present disclosure. In FIG. 4, the separated microelectronic devices 110 have been coupled to a substrate 140. The microelectronic devices 110 may be coupled to the substrate 140 via one or more adhesive layers 122, although other embodiments are also within the scope of the present disclosure. The one or more adhesive layers 122 may comprise glue, polymer adhesive, and/or other materials. The substrate 140 may comprise a wafer, a carrier, a printed circuit board (PCB), and/or other types of substrates and/or devices. In other implementations, the substrate 140 may comprise or replaced with many different types of substrates, packages, and/or package-on-package (PoP) assemblies.

Figure 5:
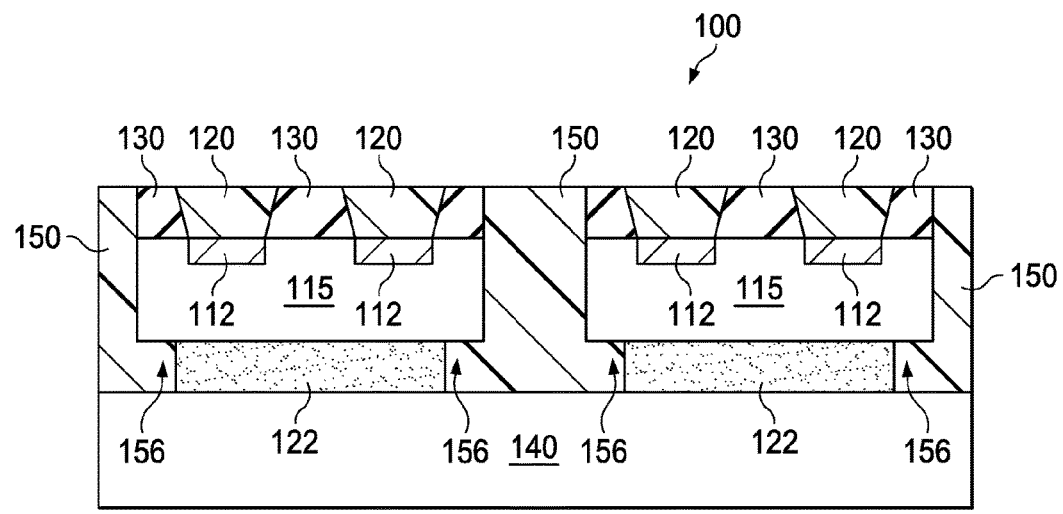
FIG. 5 is a schematic view of the apparatus shown in FIG. 4 in a subsequent stage of manufacture in accordance with some embodiments.

FIG. 5 is a sectional view of the apparatus 100 shown in FIG. 4 in a subsequent stage of manufacture according to one or more aspects of the present disclosure. In FIG. 5, a molding compound 150 has been deposited over the substrate 140. The molding compound 150 surrounds the separated microelectronic devices 110, although upper surfaces of the sacrificial layer 120 may remain uncovered. The molding compound 150 may be injected into areas between the microelectronic devices 110 and the substrate 140, perhaps via one or more injection molding and/or transfer molding processes. For example, one such molding process may involve placing the apparatus 100 within a molding chase (not shown), closing the molding chase, and injecting the molding compound 150 into a molding cavity defined around the apparatus 100 by the molding chase. Heat and/or a vacuum may be applied to the molding cavity to assist the flow and/or hardening of the molding compound 150.

One or more CMP and/or other mechanical material removal processes may also be subsequently employed, such as to remove excess molding compound 150 and/or expose upper surfaces of the sacrificial layer 120. Such processing may also include removing a sufficient portion of the sacrificial layer 120 to expose the upper surfaces of the first dielectric layer 130, such that upper surfaces of the sacrificial layer 120, the upper surfaces of the first dielectric layer 130, and the upper surfaces of the molding compound 150 may be substantially flush relative to each other. Alternatively, the portion of the sacrificial layer 120 overlying the first dielectric layer 130 may be removed by CMP and/or other mechanical material removal processes before the molding process, such that the upper surfaces of the molding compound 150 are initially formed substantially flush with the upper surfaces of the sacrificial layer 120 and/or the upper surfaces of the first dielectric layer 130.

As also illustrated in FIG. 5, the molding compound 150 may substantially fill spaces between the ones of the microelectronic devices 110 and the substrate 140. Thus, forming the molding compound 150 around the microelectronic devices 110 may include forming molded underfill structures 156.

Figure 6:
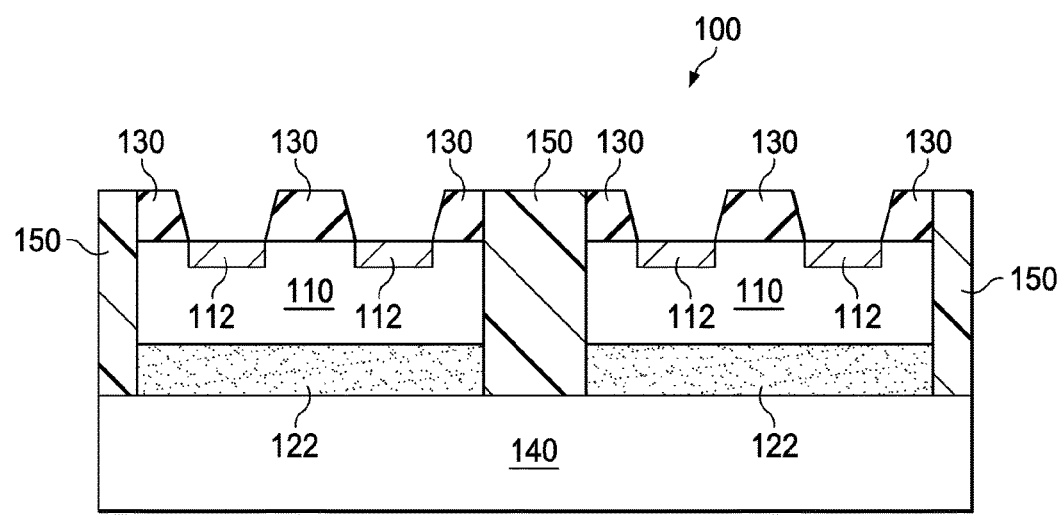
FIG. 6 is a schematic view of the apparatus shown in FIG. 5 in a subsequent stage of manufacture in accordance with some embodiments.

FIG. 6 is a sectional view of the apparatus 100 shown in FIG. 5 in a subsequent stage of manufacture according to one or more aspects of the present disclosure. In FIG. 6, at least a portion of the sacrificial layer 120 has been removed. Removing the sacrificial layer 120 may utilize one or more etchants, organic solvents, and/or other materials that may remove the sacrificial layer 120 without removing any of the first dielectric layer 130, the molding compound 150, or the microelectronic devices 110. The one or more processes utilized to remove the sacrificial layer may also remove any residue that may still be remaining on the first dielectric layer 130 from the formation of the molding compound 150. The extent to which the sacrificial layer 120 is removed may be that which is sufficient to expose at least a portion of each of the electrical contacts 112 of the microelectronic devices 110 within the openings in the first dielectric layer 130. However, the sacrificial layer 120 may also be completely removed.

Removing at least a portion of the sacrificial layer 120 may also expose upper surfaces of the first dielectric layer 130, if they were not already exposed by, for example, one or more CMP and/or other mechanical material removal processes that may have been utilized to remove excess portions of the molding compound 150. Removing at least a portion of the sacrificial layer 120 may also leave upper surfaces of one or more of the microelectronic devices (such as the electrical contacts 112) recessed below the upper surfaces of the molding compound 150. Such recessing may be to a varying depth within the scope of the present disclosure.

Figure 7:
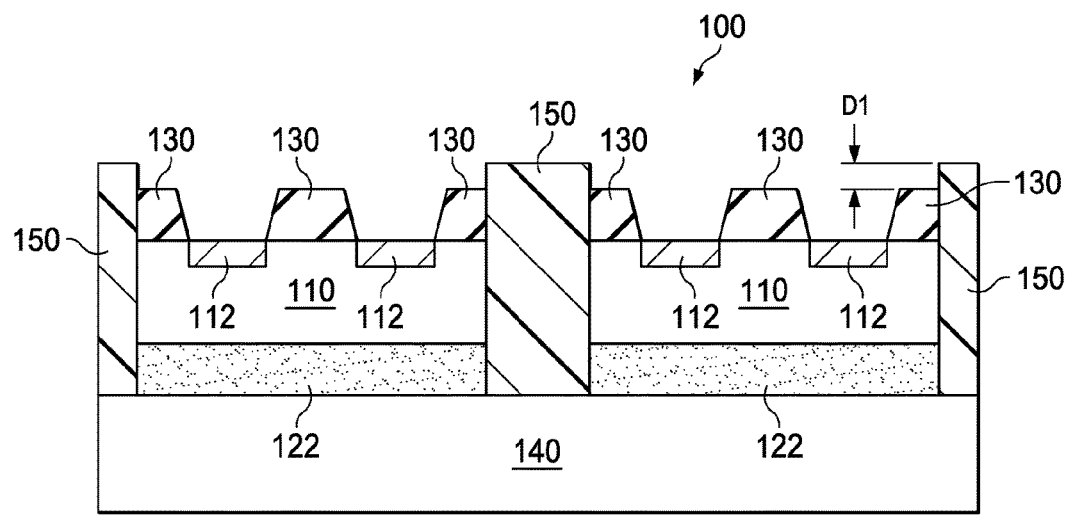
FIG. 7 is a schematic view of another embodiment of the apparatus shown in FIG. 6.

FIG. 7 is a sectional view of one example of such implementation according to one or more aspects of the present disclosure. As illustrated in FIG. 7, the upper surface of at least one of the remaining portions of the first dielectric layer 130 is recessed to a depth D1 beneath the upper surface of a nearby portion of the molding compound 150. The depth D1 may be up to about ten microns, although other depths are also within the scope of the present disclosure, and may be tuned or otherwise controlled by, for example, tuning and/or otherwise controlling the thickness of the sacrificial layer 120.

Figure 8:
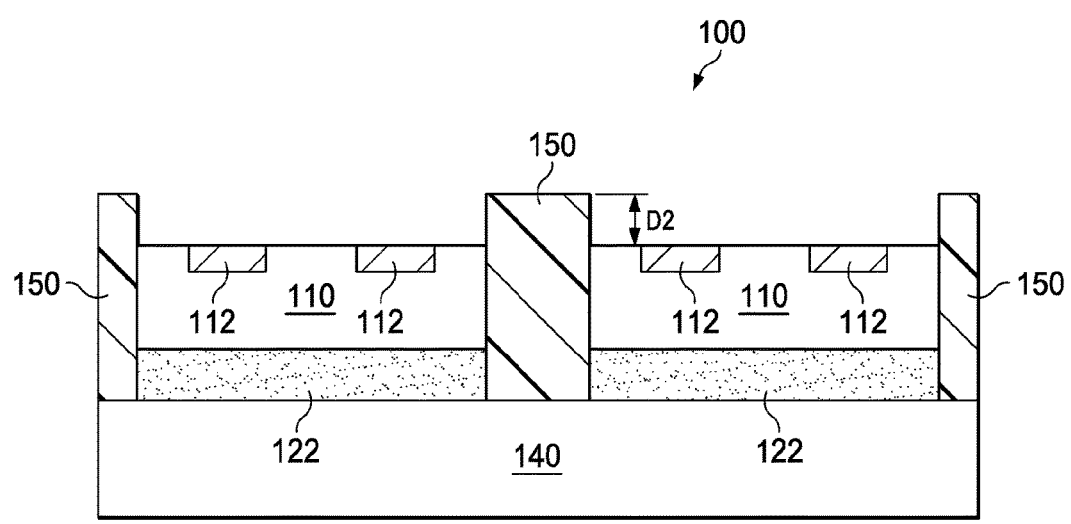
FIG. 8 is a schematic view of another embodiment of the apparatus shown in FIGS. 6 and 7.

FIG. 8 is a sectional view of a similar example depicting optional recessing of features relative to upper surfaces of the molding compound 150 according to one or more aspects of the present disclosure. The implementation depicted in FIG. 8 is lacking the first dielectric layer 130. In such embodiments, the first dielectric layer 130 may have been omitted, or it may have been substantially or entirely removed during a previous stage of manufacture.

FIG. 8 illustrates the option for the upper surface of at least one of the microelectronic devices 110 (or at least the electrical contact 112 thereof) to be recessed to a depth D2 beneath the upper surface of a nearby portion of the molding compound 150. The depth D2 may be up to about ten microns, although other depths are also within the scope of the present disclosure. As with the previous example, the depth D2 may be tuned or otherwise controlled by, for example, tuning and/or otherwise controlling the thickness of the sacrificial layer 120.

Figure 9:
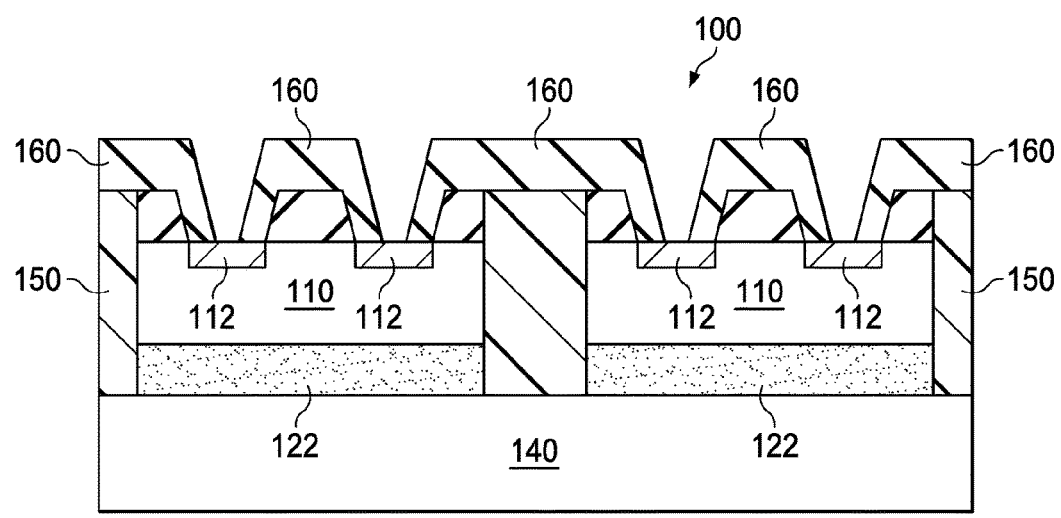
FIG. 9 is a schematic view of the apparatus shown in FIGS. 6, 7, and/or 8 in a subsequent stage of manufacture in accordance with some embodiments.

FIG. 9 is a sectional view of the apparatus 100 shown in FIG. 6 in a subsequent stage of manufacture according to one or more aspects of the present disclosure, although analogous embodiments may instead utilize the implementation shown in FIG. 7 or FIG. 8 and still remain within the scope of the present disclosure. In FIG. 9, a second dielectric layer 160 has been deposited over upper surfaces of the molding compound 150, exposed surfaces the first dielectric layer 130 (in embodiments that include the first dielectric layer 130), and upper surfaces of the microelectronic devices 110. The second dielectric layer 160 may cover portions of one or more of the electrical contacts 112 of the microelectronic devices 110. However, openings in the second dielectric layer 160 may expose at least portions of at least some of the electrical contacts 112. The second dielectric layer 160 may have a substantially smooth upper surface profile that is parallel to the substrate 140, which may be achieved via selection of thickness, materials, and/or formation processes. For example, the second dielectric layer 160 may comprise PBO and/or other dielectric materials. The second dielectric layer 160 may be deposited via CVD and/or other processes, and may subsequently be patterned by one or more photolithography processes. The thickness of the second dielectric layer 160 may range between about 5 microns and about thirty microns, although other thicknesses are also within the scope of the present disclosure.

Figure 10:
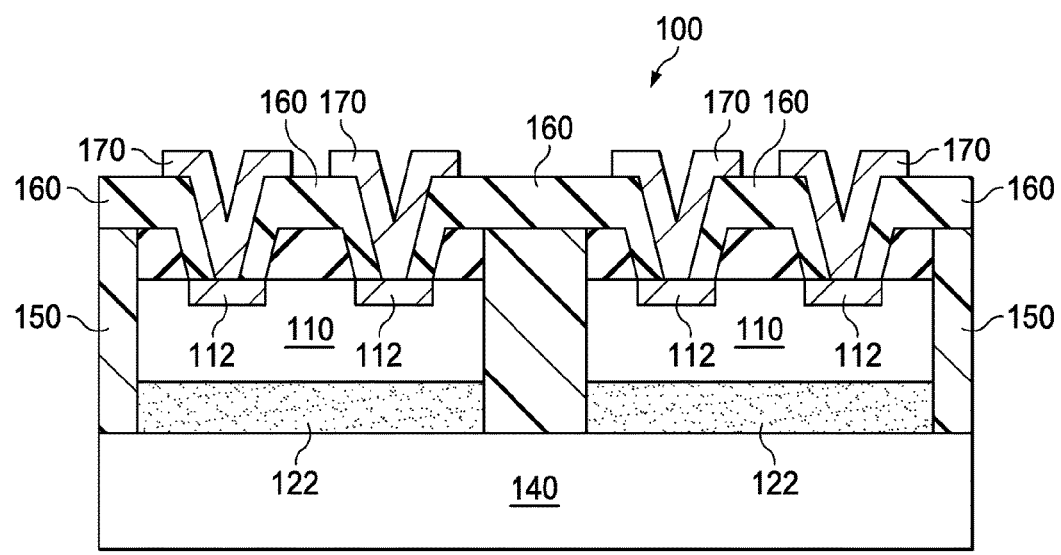
FIG. 10 is a schematic view of the apparatus shown in FIG. 9 in a subsequent stage of manufacture in accordance with some embodiments.

FIG. 10 is a sectional view of the apparatus 100 shown in FIG. 9 in a subsequent stage of manufacture according to one or more aspects of the present disclosure. In FIG. 10, a redistribution layer 170 has been formed over portions of the second dielectric layer 160. The redistribution layer 170 may extend through openings in the second dielectric layer 160 to contact at least some of the electrical contacts 112 of the microelectronic devices 110. The redistribution layer 170 may comprise copper, aluminum, doped polysilicon, and/or other materials, and may be formed via CVD, damascene, and/or other processes. The thickness of the redistribution layer 170 may range between about one micron about twenty microns, although other thicknesses are also within the scope of the present disclosure.

Although not shown in the figures, the apparatus 100 may include additional redistribution layers. One or more aspects of the present disclosure may pertain to alignment of at least the first redistribution layer 170, and perhaps others not shown in FIG. 10, relative to the electrical contacts 112 of the microelectronic devices 110. Such alignment during the current stage of manufacture may permit subsequent compensation for die shift and/or other causes of misalignment.

One or more aspects of the present disclosure may also pertain to manufacturing methods in which CMP, grinding, polishing, and/or other mechanical material removal processes may be excluded between the removal of the sacrificial layer 120 and the formation of the RDL 170. Thus, for example, there may be no such mechanical material removal processes between the manufacturing stage depicted in FIG. 6 and the manufacturing stage depicted in FIG. 10. Such implementations may lessen manufacturing costs, reduce scratching and other deformations, and/or otherwise avoid the disadvantages of many mechanical material removal processes.

Moreover, embodiments within the scope of the present disclosure may include those in which the redistribution layer 170 land on only one or two different materials. To the contrary, conventional devices may include redistribution layers that land on three or more different materials, which can encourage delamination and/or other failures. However, according to one or more aspects of the present disclosure, the only layers below and contacted by the redistribution layer 170 are the electrical contacts 112 of the microelectronic devices 110 and the second dielectric layer 160. Accordingly, delamination may be less likely for implementations within the scope of the present disclosure.

Figure 11:
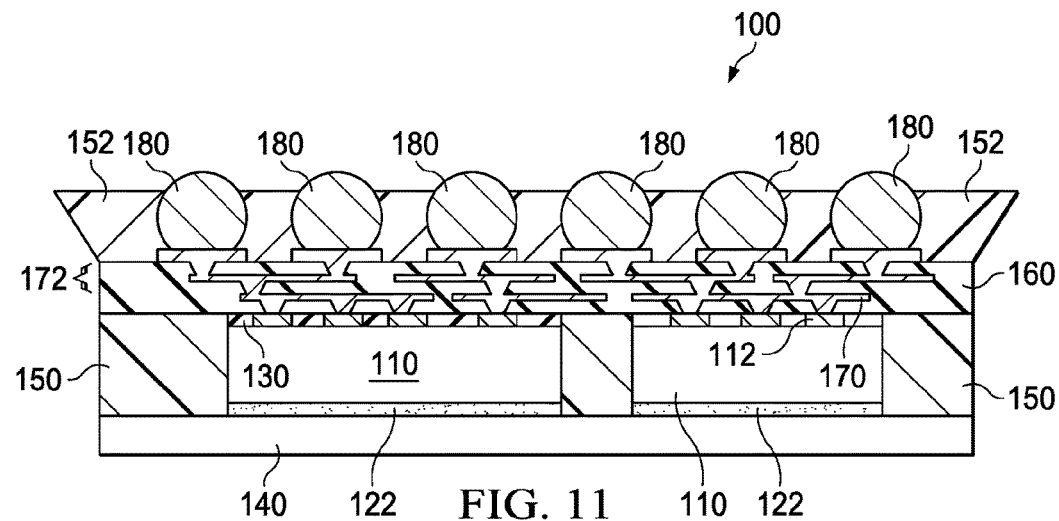
FIG. 11 is a schematic view of the apparatus shown in FIG. 10 in a subsequent stage of manufacture in accordance with some embodiments.

FIG. 11 is a sectional view of the apparatus 100 shown in FIG. 10 in a subsequent stage of manufacture according to one or more aspects of the present disclosure. In FIG. 11, additional redistribution layers 172 have been formed over the redistribution layer 170, and a ball-grid array (BGA) 180 has been coupled to the topmost redistribution layer 172. FIG. 11 also depicts a second layer of molding compound 152 formed above the topmost redistribution layer 172 and in the spaces between the elements of the BGA 180. The second molding compound 152 may be substantially similar in composition and/or formation relative to the molding compound 150.

Figure 12:
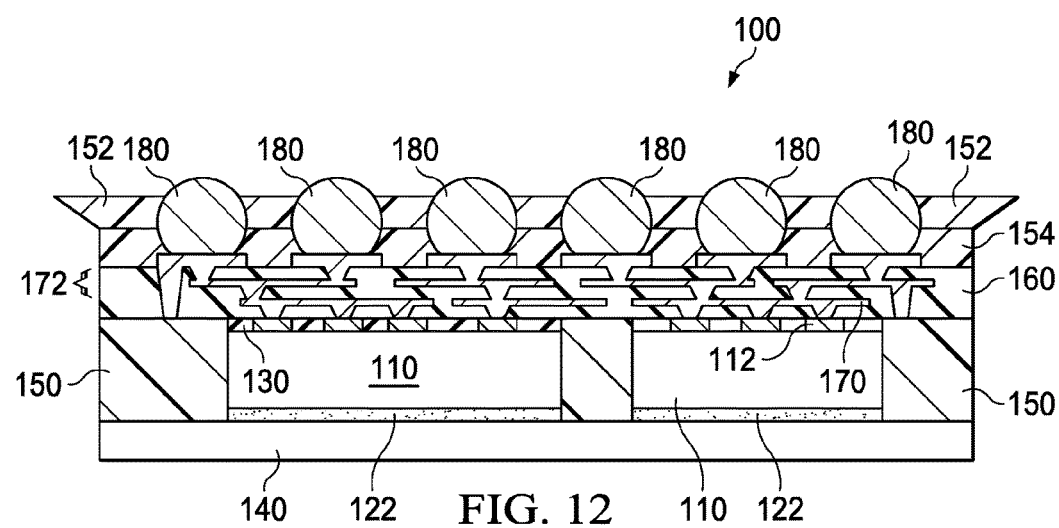
FIG. 12 is a schematic view of another embodiment of the apparatus shown in FIG. 11.

FIG. 12 is a sectional view of another embodiment of the apparatus 100 shown in FIG. 11 according to one or more aspects of the present disclosure. In FIG. 12, the apparatus 100 comprises a liquid molding compound 154 above the topmost redistribution layer 172 and in the spaces between the elements of the BGA 180. In such embodiments, the apparatus 100 may still include the second molding compound 152 above the liquid molding compound 154 and in spaces between elements of the BGA 180. However, instead of the liquid molding compound 154, or in addition thereto, the apparatus 100 may comprise a silicon nitride layer, perhaps with a germanium-ion implantation to selectively relax stress, although other materials are also within the scope of the present disclosure.

Figure 13:
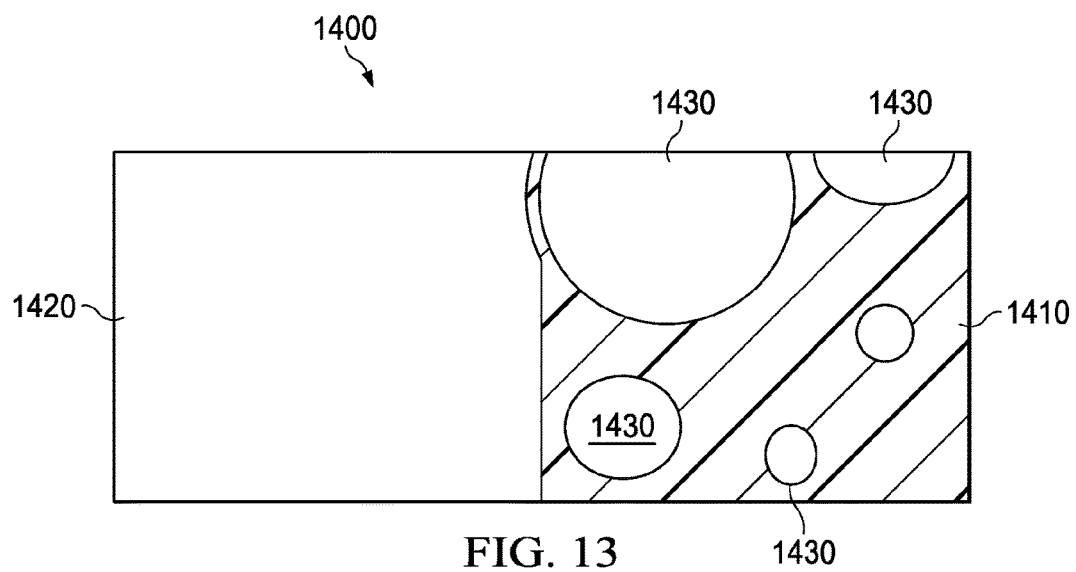
FIG. 13 is a schematic view of a portion of prior art apparatus.

FIG. 13 is a schematic view of a portion of a prior art apparatus 1400 comprising a molding compound 1410 adjacent to a microelectronics device 1420. The molding compound 1410 comprises micro-filler elements 1430 that have been damaged by CMP, grinding, and/or other mechanical material removal processes, such that boundaries of some of the micro-filler elements 1430 are substantially planar and parallel to one or more surfaces of the molding compound 1410 and/or the microelectronics device 1420. Such parallelism and/or the resulting uneven profile of the molding compound 1410 may present delamination and/or problems for device assembly and/or function.

Figure 14:
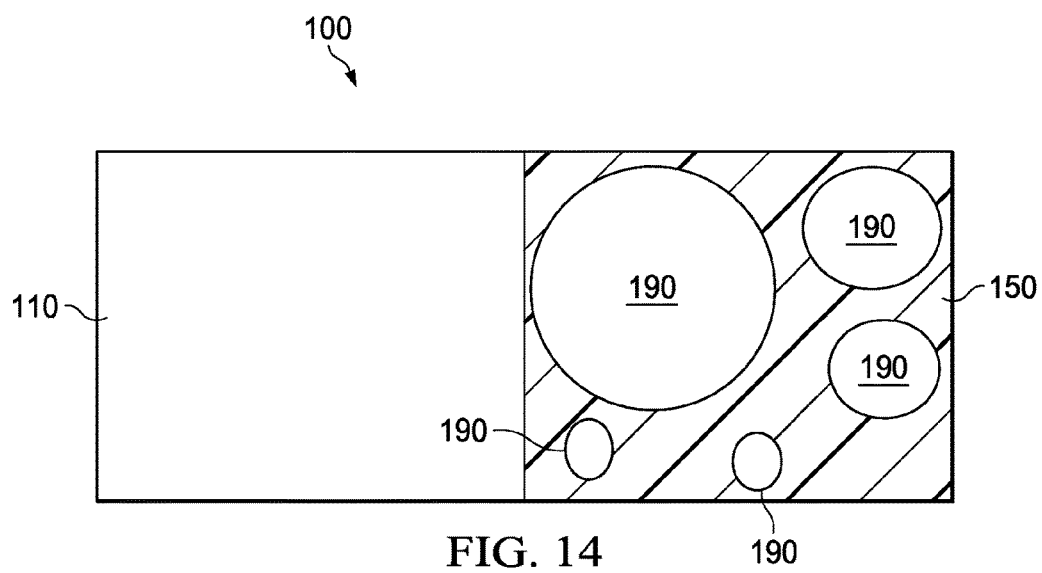
FIG. 14 is a schematic view of a portion of the apparatus shown in FIG. 11 or 12 in accordance with some embodiments.

FIG. 14 is a schematic view of a corresponding portion of the apparatus 100 shown in FIG. 11 or 12 according to one or more aspects of the present disclosure. As with the prior art apparatus 1400 depicted in FIG. 13, the molding compound 150 of the present disclosure may include micro-filler elements 190. The micro-filler elements 190 may comprise glass spheres, although other materials and geometric shapes are also within the scope of the present disclosure. However, whereas the micro-filler elements 1430 shown in FIG. 13 have been damaged, the micro-filler elements 190 shown in FIG. 14 are intact.

As described above, aspects of the present disclosure may pertain to manufacturing methods that exclude mechanical material removal processes between removal of the sacrificial layer 120 and formation of the redistribution layer 170, including during the formation of the molding compound 150. Accordingly, for embodiments in which the molding compound 150 comprises micro-filler elements 190, the micro-filler elements 190 may remain substantially whole and intact, having not been compromised by any mechanical material removal processes. As such, the micro-filler elements 190 may be maintained as substantially regularly-shaped, geometric, three-dimensional elements, and may not include any boundaries that are substantially parallel to any surfaces of the molding compound 150 and/or microelectronics device 110. At most, the boundaries of the micro-filler elements 190 disposed at any boundary of the molding compound 150 may be tangent to a surface of the molding compound 150 and/or the microelectronics device 110, but they will not be substantially parallel to any surface of the molding compound 150 and/or the microelectronics device 110.

Figure 15:
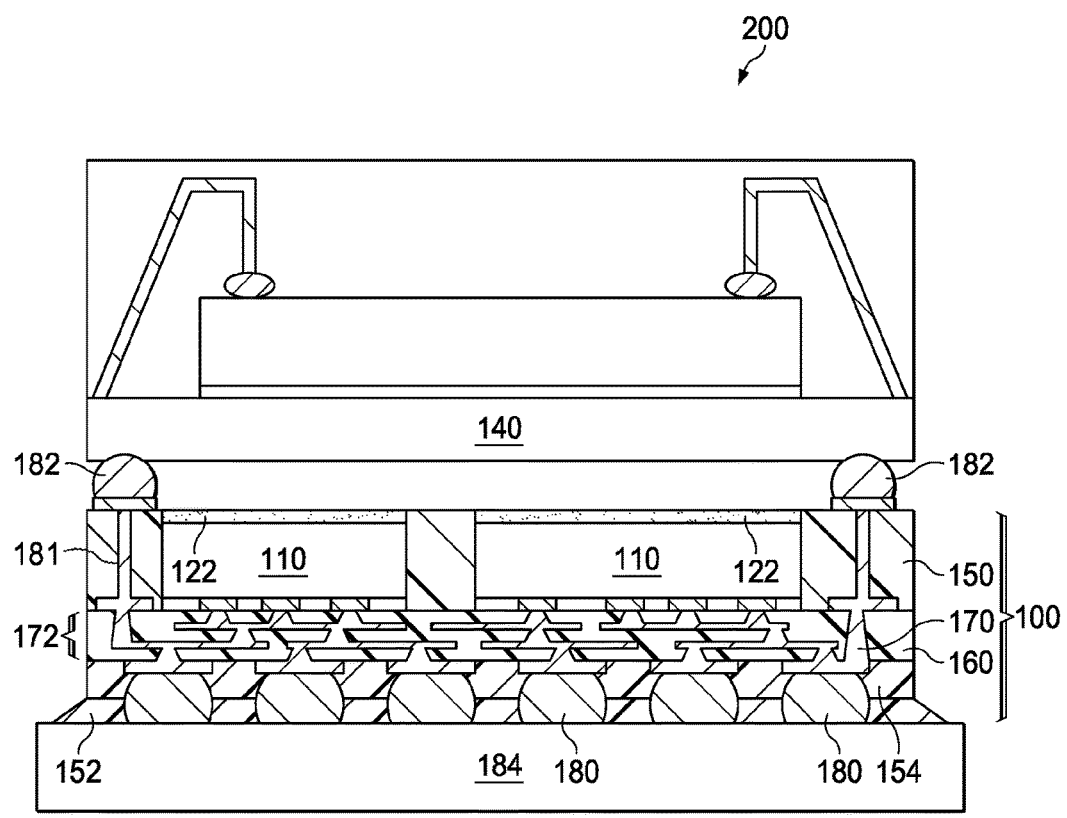
FIG. 15 is a schematic view of the apparatus shown in FIG. 12 in a subsequent stage of manufacture in accordance with some embodiments.

FIG. 15 is a sectional view of at least a portion of the apparatus 100 shown in FIG. 12 incorporated in a package-on-package (PoP) type apparatus 200 according to one or more aspects of the present disclosure. In FIG. 15, the apparatus 100 shown in FIG. 12 is oriented upside down, such that the BGA 180 appears near the bottom of the apparatus 100 instead of the top. Also, in the embodiment depicted in FIG. 15, the substrate 140 includes or has been replaced by a dynamic random-access memory (DRAM) device, and is coupled to the remainder of the apparatus 100 (e.g., vias 181) via one or more solder balls 182 and/or other mechanical and/or electrical means. The apparatus 200 is also depicted as comprising an additional substrate 184, which may be or comprise a PCB and/or other substrate typical of PoP apparatus.

In view of all of the above, as well as the example implementations depicted in FIGS. 1-12, 14 and 15, a person having ordinary skill in the art will readily recognize that the present disclosure introduces one or more methods comprising forming a sacrificial layer over a plurality of microelectronic devices, including over an electrical contact of each microelectronic device. The microelectronic devices are coupled together by a first substrate. The microelectronic devices are then separated and coupled to a second substrate. A molding compound is then formed on the second substrate around each microelectronic device while leaving exposed an area of the sacrificial layer overlying the electrical contact of each microelectronic device.

In an embodiment, a device includes: a microelectronic device having a first surface, the microelectronic device including a contact at the first surface; a molding compound at least partially encapsulating the microelectronic device, the molding compound including a plurality of micro-filler elements, no boundary of any of the micro-filler elements being substantially parallel to a substantially planar surface of the molding compound; a through via adjacent the microelectronic device, the through via extending through the molding compound; a dielectric layer over the through via, the molding compound, and the first surface of the microelectronic device; and a redistribution layer extending through the dielectric layer, the redistribution layer electrically connecting the through via and the contact of the microelectronic device.

In some embodiments, the device further includes: a ball grid array connector electrically connected to the contact through the redistribution layer. In some embodiments of the device, the molding compound extends along side surfaces and at least partially over a bottom surface of the microelectronic device. In some embodiments of the device, the first surface of the microelectronic device is recessed relative a topmost surface of the molding compound. In some embodiments of the device, the first surface of the microelectronic device is recessed relative the topmost surface of the molding compound by a distance of up to about ten microns. In some embodiments, the device further includes: a first substrate; first conductors electrically connecting the first substrate to the through via; a second substrate; and second conductors electrically connecting the second substrate to the redistribution layer, the microelectronic device being disposed between the first substrate and the second substrate. In some embodiments of the device, the micro-filler elements include glass spheres. In some embodiments of the device, the micro-filler elements include regularly-shaped geometric three-dimensional elements. In some embodiments of the device, at least one of the plurality of micro-filler elements is tangent to a surface of the molding compound.

In an embodiment, a device includes: a molding compound including a plurality of micro-filler elements, no boundary of any of the micro-filler elements being substantially parallel to a substantially planar surface of the molding compound; a microelectronic device encapsulated in the molding compound, an upper surface of the microelectronic device being recessed beneath an upper surface of the molding compound, the microelectronic device including a contact; a through via adjacent the microelectronic device in the molding compound; a dielectric layer over the through via, the microelectronic device, and the molding compound; and a redistribution layer extending through the dielectric layer, the redistribution layer electrically connecting the through via and the contact of the microelectronic device.

In some embodiments, the device further includes: a first substrate; and first conductors electrically connecting the first substrate to the through via. In some embodiments, the device further includes: a second substrate; and second conductors electrically connecting the second substrate to the redistribution layer, the microelectronic device being disposed between the first substrate and the second substrate. In some embodiments of the device, the micro-filler elements include glass spheres. In some embodiments of the device, the micro-filler elements include regularly-shaped geometric three-dimensional elements. In some embodiments of the device, at least one of the plurality of micro-filler elements is tangent to a surface of the molding compound.

In an embodiment, a device includes: a plurality of microelectronic devices spaced apart from each other; a molding compound encapsulating the microelectronic devices, the molding compound including a plurality of micro-filler elements, no micro-filler elements being exposed at a substantially planar surface of the molding compound; a through via extending through the molding compound; a dielectric layer over the microelectronic devices and the molding compound; and a redistribution layer extending through the dielectric layer, the redistribution layer electrically connecting the through via and the microelectronic devices.

In some embodiments, the device further includes: a first substrate; first conductors electrically connecting the first substrate to the through via; a second substrate; and second conductors electrically connecting the second substrate to the redistribution layer, the microelectronic devices being disposed between the first substrate and the second substrate. In some embodiments of the device, the micro-filler elements include glass spheres. In some embodiments of the device, the micro-filler elements include regularly-shaped geometric three-dimensional elements. In some embodiments of the device, at least one of the plurality of micro-filler elements is tangent to a surface of the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a microelectronic device having a first surface, the microelectronic device comprising a contact at the first surface;
a molding compound at least partially encapsulating the microelectronic device, the molding compound comprising a plurality of micro-filler elements, no boundary of any of the micro-filler elements being substantially parallel to a substantially planar surface of the molding compound;
a through via adjacent the microelectronic device, the through via extending through the molding compound;
a dielectric layer over the through via, the molding compound, and the first surface of the microelectronic device; and
a redistribution layer extending through the dielectric layer, the redistribution layer electrically connecting the through via and the contact of the microelectronic device.

2. The device of claim 1, further comprising:
a ball grid array connector electrically connected to the contact through the redistribution layer.

3. The device of claim 1, wherein the molding compound extends along side surfaces and at least partially over a bottom surface of the microelectronic device.

4. The device of claim 1, wherein the first surface of the microelectronic device is recessed relative a topmost surface of the molding compound.

5. The device of claim 4, wherein the first surface of the microelectronic device is recessed relative the topmost surface of the molding compound by a distance of up to about ten microns.

6. The device of claim 1, further comprising:
a first substrate;
first conductors electrically connecting the first substrate to the through via;
a second substrate; and
second conductors electrically connecting the second substrate to the redistribution layer, the microelectronic device being disposed between the first substrate and the second substrate.

7. The device of claim 1, wherein the micro-filler elements comprise glass spheres.

8. The device of claim 1, wherein the micro-filler elements comprise regularly-shaped geometric three-dimensional elements.

9. The device of claim 1, wherein at least one of the plurality of micro-filler elements is tangent to a surface of the molding compound.

10. A device comprising:
a molding compound comprising a plurality of micro-filler elements, no boundary of any of the micro-filler elements being substantially parallel to a substantially planar surface of the molding compound;
a microelectronic device encapsulated in the molding compound, an upper surface of the microelectronic device being recessed beneath an upper surface of the molding compound, the microelectronic device comprising a contact;
a through via adjacent the microelectronic device in the molding compound;
a dielectric layer over the through via, the microelectronic device, and the molding compound; and
a redistribution layer extending through the dielectric layer, the redistribution layer electrically connecting the through via and the contact of the microelectronic device.

11. The device of claim 10, further comprising:
a first substrate; and
first conductors electrically connecting the first substrate to the through via.

12. The device of claim 11, further comprising:
a second substrate; and
second conductors electrically connecting the second substrate to the redistribution layer, the microelectronic device being disposed between the first substrate and the second substrate.

13. The device of claim 10, wherein the micro-filler elements comprise glass spheres.

14. The device of claim 10, wherein the micro-filler elements comprise regularly-shaped geometric three-dimensional elements.

15. The device of claim 10, wherein at least one of the plurality of micro-filler elements is tangent to a surface of the molding compound.

16. A device comprising:
a plurality of microelectronic devices spaced apart from each other;
a molding compound encapsulating the microelectronic devices, the molding compound comprising a plurality of micro-filler elements, no micro-filler elements being exposed at a substantially planar surface of the molding compound;
a through via extending through the molding compound;
a dielectric layer over the microelectronic devices and the molding compound; and
a redistribution layer extending through the dielectric layer, the redistribution layer electrically connecting the through via and the microelectronic devices.

17. The device of claim 16, further comprising:
a first substrate;
first conductors electrically connecting the first substrate to the through via;
a second substrate; and
second conductors electrically connecting the second substrate to the redistribution layer, the microelectronic devices being disposed between the first substrate and the second substrate.

18. The device of claim 16, wherein the micro-filler elements comprise glass spheres.

19. The device of claim 16, wherein the micro-filler elements comprise regularly-shaped geometric three-dimensional elements.

20. The device of claim 16, wherein at least one of the plurality of micro-filler elements is tangent to a surface of the molding compound.

* * * * *